(12) United States Patent
Wang et al.

(10) Patent No.: US 9,438,972 B2
(45) Date of Patent: Sep. 6, 2016

(54) SILICON BASED MEMS MICROPHONE, A SYSTEM AND A PACKAGE WITH THE SAME

(75) Inventors: Zhe Wang, Singapore (SG); Mengjin Cai, WeiFang (CN)

(73) Assignee: GOERTEK INC. (CN)

( * ) Notice: Subject to any disclaimer, the term of this patent is extended or adjusted under 35 U.S.C. 154(b) by 185 days.

(21) Appl. No.: 13/582,141

(22) PCT Filed: Dec. 29, 2011

(86) PCT No.: PCT/CN2011/084889
§ 371 (c)(1),
(2), (4) Date: Aug. 31, 2012

(87) PCT Pub. No.: WO2013/097135
PCT Pub. Date: Jul. 4, 2013

(65) Prior Publication Data
US 2014/0299948 A1    Oct. 9, 2014

(51) Int. Cl.
| H04R 11/04 | (2006.01) |
| --- | --- |
| H04R 1/02 | (2006.01) |
| H04R 1/08 | (2006.01) |
| H04R 19/00 | (2006.01) |
| B81B 7/00 | (2006.01) |
| H04R 7/04 | (2006.01) |
| H04R 19/04 | (2006.01) |

(52) U.S. Cl.
CPC ............. *H04R 1/02* (2013.01); *B81B 7/0061* (2013.01); *H04R 1/086* (2013.01); *H04R 7/04* (2013.01); *H04R 19/005* (2013.01); *B81B 2201/0257* (2013.01); *H01L 2924/1461* (2013.01); *H04R 19/04* (2013.01); *H04R 2201/003* (2013.01); *H04R 2201/02* (2013.01); *H04R 2207/00* (2013.01)

(58) Field of Classification Search
CPC .... H04R 19/04; H04R 19/005; H04R 1/086; H04R 7/04
USPC .......................................... 381/355; 257/416
See application file for complete search history.

(56) References Cited

U.S. PATENT DOCUMENTS

2012/0237073 A1*  9/2012  Goida et al. .................. 381/361

FOREIGN PATENT DOCUMENTS

| CN | 1352515 A | 6/2002 |
| --- | --- | --- |
| CN | 101631739 A | 1/2010 |

* cited by examiner

*Primary Examiner* — Marc Armand
*Assistant Examiner* — Tifney Skyles
(74) *Attorney, Agent, or Firm* — Troutman Sanders LLP

(57) ABSTRACT

The present invention relates to a silicon based MEMS microphone, comprising a silicon substrate and an acoustic sensing part supported on the silicon substrate, wherein a mesh-structured back hole is formed in the substrate and aligned with the acoustic sensing part, the mesh-structured back hole includes a plurality of mesh beams which are interconnected with each other and supported on the side wall of the mesh-structure back hole, the plurality of mesh beams and the side wall define a plurality of mesh holes which all have a tapered profile and merge into one hole in the vicinity of the acoustic sensing part at the top side of the silicon substrate. The mesh-structured back hole can help to streamline the air pressure pulse caused, for example, in a drop test and thus reduce the impact on the acoustic sensing part of the microphone, and also serve as a protection filter to prevent alien substances such as particles entering the microphone.

10 Claims, 7 Drawing Sheets

SILICON BASED MEMS MICROPHONE, A SYSTEM AND A PACKAGE WITH THE SAME

This application is a US National Stage of International Application No. PCT/CN2011/084889 filed 29 Dec. 2011.

FIELD OF THE INVENTION

The present invention relates to the field of microphone technology, and more specifically, to a silicon based MEMS microphone.

BACKGROUND

Silicon based MEMS microphones, also known as acoustic transducers, have been in research and development for many years. The silicon based MEMS microphones may be widely used in many applications, such as cell phones, tablet PCs, cameras, hearing aids, smart toys and surveillance devices due to their potential advantages in miniaturization, performances, reliability, environmental endurance, costs and mass production capability.

In general, a silicon based MEMS microphone consists of a fixed perforated backplate and a highly compliant diaphragm with an air gap formed in between. The perforated backplate and the compliant diaphragm, forming a variable air-gap condenser, are typically formed on a single silicon substrate, with one of which being directly exposed to the outside through a back hole formed in the silicon substrate.

Patent application No. WO 02/15636 discloses an acoustic transducer, which has a diaphragm positioned between a cover member (equivalent to the said backplate) and a substrate. The diaphragm, made of low stress polysilicon, is directly above a back hole formed in the substrate and can be laterally movable within a plane parallel to the planar surface of the cover member. The floating diaphragm is free to move in its own plane, and thus can release its intrinsic stress, resulting very consistent mechanical compliance.

Patent document PCT/DE97/02740 discloses a miniaturized microphone, in which an SOI substrate is used for formation of the microphone and related CMOS circuits. Specifically, the silicon layer of the SOI substrate is used to form the backplate of the microphone which is directly above a back hole formed in the SOI substrate, and a subsequently deposited polysilicon thin film, which is above the backplate with an air gap in between and is exposed to the outside through the opening in the backplate and the back hole in the SOI substrate, serves to be the diaphragm of the microphone.

When a silicon microphone is packaged, it is usually mounted on a printed circuit board (PCB) with the back hole formed in the substrate of the microphone aligned with an acoustic port formed on the PCB board, so that an external acoustic wave can easily reach and vibrate the diaphragm of the microphone. For example, FIG. 1 shows a cross-sectional view of an exemplary structure of a conventional silicon based MEMS microphone package. As shown in FIG. 1, in the conventional MEMS microphone package, a MEMS microphone 10' and other integrated circuits 20 are mounted on a PCB board 30 and enclosed by a cover 40, wherein a back hole 140' formed in the substrate of the MEMS microphone 10' is aligned with an acoustic port 35 formed on the PCB board 30. An external acoustic wave, as shown by the arrows in FIG. 1, travels through the acoustic port 35 on the PCB board 30 and the back hole 140' in the substrate of the microphone 10' to vibrate the diaphragm of the microphone 10'.

However, as can be seen from the above description, there exist problems with either the stand-alone conventional MEMS microphones or the conventional MEMS microphone package. With such a structure having a widely opened back hole in the substrate of the conventional microphones and/or acoustic port on the PCB board, the diaphragm of the conventional microphones is easily damaged due to the air pressure pulse caused, for example, in a drop test, and on the other hand, alien substances such as particles are easily trapped inside the microphone through the back hole and/or the acoustic port.

SUMMARY

In order to solve the above problems, the present invention provides a silicon based MEMS microphone with a mesh-structured back hole, which may help to streamline the air pressure pulse caused, for example, in a drop test and thus reduce the impact on the acoustic sensing part of the microphone, and also serve as a protection filter to prevent alien substances such as particles entering the microphone.

In one aspect of the present invention, there is provided a silicon based MEMS microphone, comprising a silicon substrate and an acoustic sensing part supported on the silicon substrate, wherein a mesh-structured back hole is formed in the substrate and aligned with the acoustic sensing part; the mesh-structured back hole includes a plurality of mesh beams which are interconnected with each other and supported on the side wall of the mesh-structure back hole; the plurality of mesh beams and the side wall define a plurality of mesh holes which all have a tapered profile and merge into one hole in the vicinity of the acoustic sensing part at the top side of the silicon substrate.

Preferably, the mesh-structured back hole may be formed from the bottom side of the silicon substrate using a controlled deep reactive ion etching process.

Preferably, the plurality of mesh holes of the mesh-structured back hole may be uniformly and/or symmetrically distributed across the mesh-structured back hole.

Preferably, the mesh-structured back hole may be provided with a circular shape, a square shape, a rectangular shape or other polygonal shape.

The acoustic sensing part of the said microphone may include at least a compliant diaphragm, a perforated backplate, and an air gap formed between the diaphragm and the backplate, wherein the diaphragm and the backplate are used to form electrode plates of a variable condenser.

In one example, said compliant diaphragm may be formed with a part of a silicon device layer stacked on the silicon substrate with an oxide layer sandwiched in between, said perforated backplate may be located above the diaphragm and formed with CMOS passivation layers with a metal layer imbedded therein which serves as an electrode plate of the backplate, and the acoustic sensing part of the said microphone may further include an interconnection column provided between the center of the diaphragm and the center of the backplate for mechanically suspending and electrically wiring out the diaphragm using CMOS metal interconnection method, and the periphery of the diaphragm is free to vibrate. In this case, preferably, the mesh-structured back hole may include a central mesh beam extending from the bottom side to the top side of the silicon substrate and attaching to the center of the diaphragm as a supporting anchor.

In another example, said compliant diaphragm may be formed with a part of a silicon device layer stacked on the silicon substrate with an oxide layer sandwiched in between, said perforated backplate may be located above the diaphragm and formed with CMOS passivation layers with a metal layer imbedded therein which serves as an electrode plate of the backplate, and the acoustic sensing part of the said microphone may further include an interconnection column provided between the edge of diaphragm and the edge of the backplate for electrically wiring out the diaphragm using CMOS metal interconnection method, and the periphery of the diaphragm is fixed.

In another aspect of the present invention, there is provided with a microphone system, comprising any silicon based MEMS microphone described above and a CMOS circuitry which are integrated on a single chip.

In still another aspect of the present invention, there is provided with a microphone package, comprising a PCB board; any silicon based MEMS microphone described above, mounted on the PCB board; and a cover, enclosing the microphone, wherein an acoustic port may be formed on any of the PCB board and the cover, and aligned with the mesh-structured back hole of the microphone.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE DRAWINGS

The objectives and features of the present invention will become apparent from the following description of embodiments, given in conjunction with the accompanying drawings, in which.

DETAILED DESCRIPTION

Figure 1:
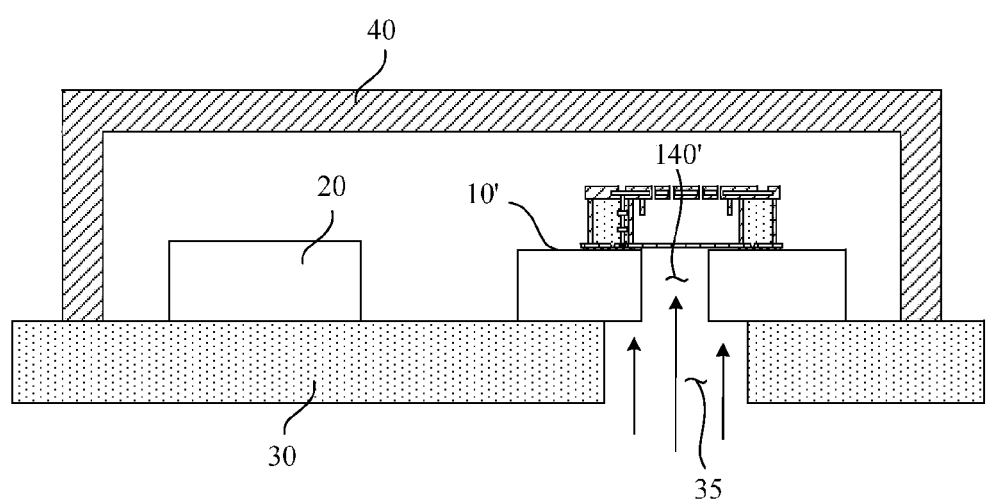
FIG. 1 is a cross-sectional view showing an exemplary structure of a conventional silicon based MEMS microphone package.

Various aspects of the claimed subject matter are now described with reference to the drawings, wherein the illustrations in the drawings are schematic and not to scale, and like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Generally speaking, a silicon based MEMS microphone, which specifically means an acoustic sensing element herein, may comprise a silicon substrate and an acoustic sensing part supported on the silicon substrate. Specifically, the acoustic sensing part of the said microphone may include at least a compliant diaphragm, a perforated backplate, and an air gap formed between the diaphragm and the backplate, wherein the diaphragm and the backplate are used to form electrode plates of a variable condenser. The inventive concepts of the present invention are as follows: a mesh-structured back hole is formed in the substrate and aligned with the acoustic sensing part of the microphone so that an external acoustic wave traveling through the mesh-structured back hole can be streamlined to have less impact on the acoustic sensing part of the microphone, and alien substances such as particles can be prevented from entering the microphone through the mesh-structured back hole, In more detail, the mesh-structured back hole may include a plurality of mesh beams, which are interconnected with each other and supported either directly or indirectly on the side wall of the mesh-structure back hole. In the meantime, the plurality of mesh beams and the side wall define a plurality of mesh holes which all have a tapered profile and merge into one hole in the vicinity of the acoustic sensing part at the top side of the silicon substrate.

Hereinafter, embodiments of the present invention will be described in details with reference to the accompanying drawings to explain the structure of the microphone described above.

The First Embodiment

Figure 2:
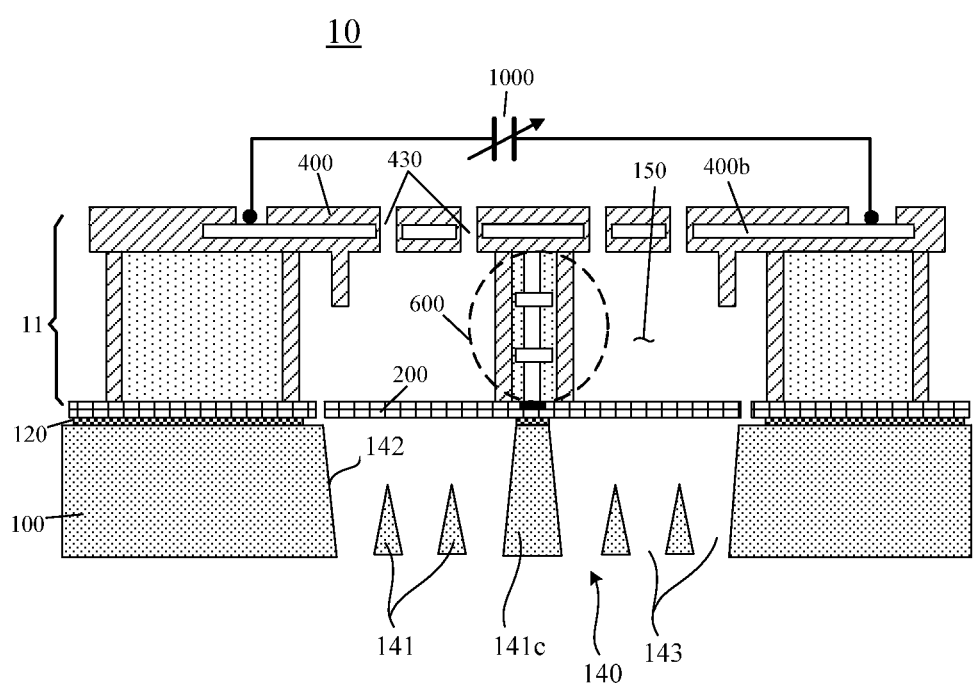
FIG. 2 is a cross-sectional view showing the structure of the silicon based MEMS microphone according to the first embodiment of the present invention.

FIG. 2 is a cross-sectional view showing the structure of the silicon based MEMS microphone according to the first embodiment of the present invention. A MEMS microphone may receive an acoustic signal and transform the received acoustic signal into an electrical signal for the subsequent processing and output. As shown in FIG. 2, the silicon based MEMS microphone 10 according to the first embodiment of the present invention may include a silicon substrate 100 and an acoustic sensing part 11 supported on the silicon substrate 100 with an isolating oxide layer 120 sandwiched in between. The acoustic sensing part 11 of the microphone 10 may include at least: a conductive and compliant diaphragm 200, a perforated backplate 400, and an air gap 150. The diaphragm 200 is formed with a part of a silicon device layer such as the top-silicon film on a silicon-on-insulator (SOI) wafer or with a polycrystalline silicon (Poly-Si) membrane through a deposition process. The perforated backplate 400 is located above the diaphragm 200, and formed with CMOS passivation layers with a metal layer 400b imbedded therein which serves as an electrode plate of the backplate 400. The air gap 150 is formed between the diaphragm 200 and the backplate 400. The conductive and compliant diaphragm 200 serves as a vibration membrane which vibrates in response to an external acoustic wave reaching the diaphragm 200 from the outside, as well as an electrode. The backplate 400 provides another electrode of the acoustic sensing part 11, and has a plurality of through holes 430 formed thereon, which are used for air ventilation so as to reduce air damping that the diaphragm 200 will encounter when starts vibrating. Therefore, the diaphragm 200 is used as an electrode plate to form a variable condenser 1000 with the electrode plate of the backplate 400.

In the silicon based MEMS microphone 10 as shown in FIG. 2, the acoustic sensing part 11 of the microphone 10 may further include an interconnection column 600 provided between the center of the diaphragm 200 and the center of the backplate 400 for mechanically suspending and electrically wiring out the diaphragm 200 using CMOS metal interconnection method, and the periphery of the diaphragm 200 is free to vibrate. An example of the acoustic sensing part 11 as above is described in details in the international application No. PCT/CN2010/075514, the related contents of which are incorporated herein by reference.

Furthermore, in the silicon based MEMS microphone 10 according to the first embodiment of present invention, as shown in FIG. 2, a mesh-structured back hole 140 is formed in the substrate 100 and aligned with the acoustic sensing part 11 of the microphone 10 so that an external acoustic wave traveling through the mesh-structured back hole 140 can be streamlined to have less impact on the acoustic sensing part 11 of the microphone 10, and alien substances such as particles can be prevented from entering the microphone through the mesh-structured back hole 140.

Figure 3:
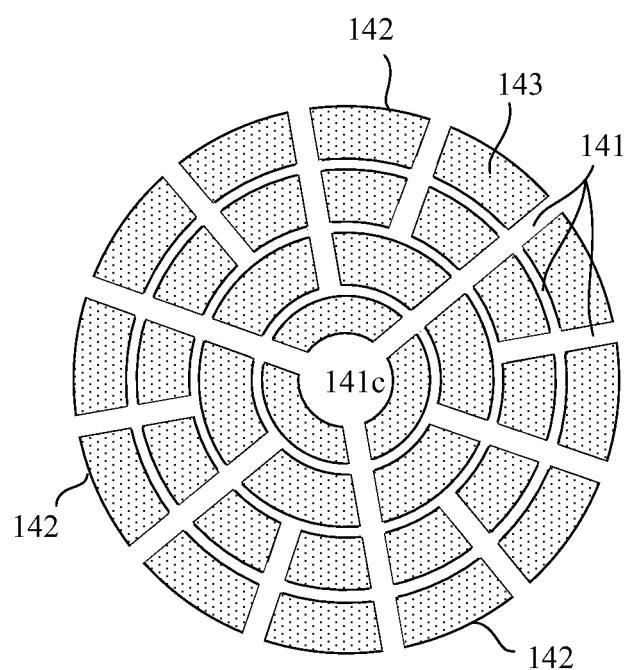
FIG. 3 is a plan view showing an exemplary pattern of the mesh-structured back hole formed in the silicon substrate of the microphone of FIG. 2 when viewed from the bottom side of the silicon substrate.
Figure 4:
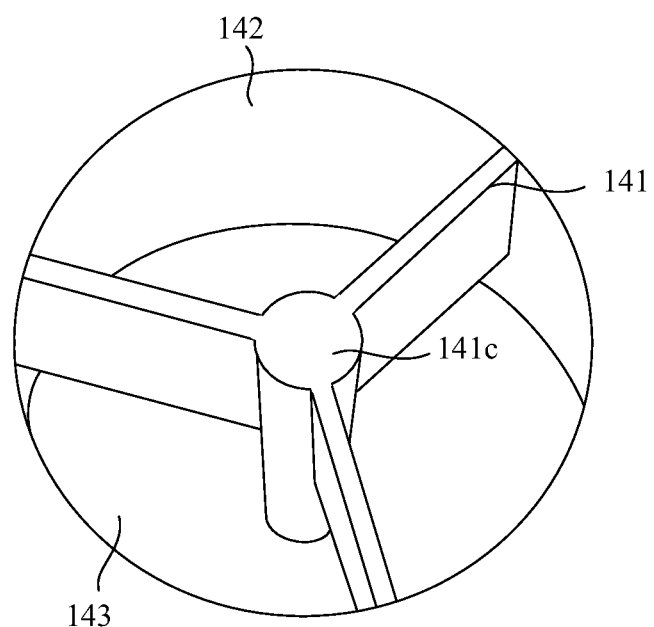
FIG. 4 is a perspective view, showing a simplified structure of the mesh-structured back hole of FIG. 3 when viewed from the bottom side of the silicon substrate.
Figure 5:
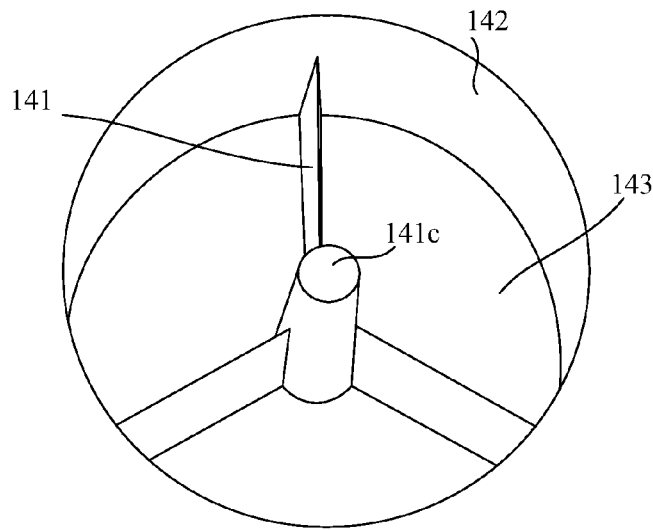
FIG. 5 is a perspective view, showing a simplified structure of the mesh-structured back hole of FIG. 3 when viewed from the top side of the silicon substrate.

FIG. 3 is a plan view showing an exemplary pattern of the mesh-structured back hole formed in the silicon substrate of the microphone of FIG. 2 when viewed from the bottom side of the silicon substrate. FIG. 4 and FIG. 5 are perspective views, showing a simplified structure of the mesh-structured back hole of FIG. 3 when viewed from the bottom side and the top side of the silicon substrate, respectively. As shown in FIG. 2-5, the mesh-structured back hole 140 may include a plurality of mesh beams 141, which are interconnected with each other and supported either directly or indirectly on the side wall 142 of the mesh-structure back hole 140. In the meantime, the plurality of mesh beams 141 and the side wall 142 define a plurality of mesh holes 143 which all have a tapered profile and merge into one hole in the vicinity of the acoustic sensing part 11 at the top side of the silicon substrate 100.

The mesh-structured back hole 140 may be formed from the bottom side of the silicon substrate using a controlled deep reactive ion etching process. In the controlled deep reactive ion etching process, the plurality of mesh holes 143 can be formed with a tapered profile as shown in FIG. 2-5 by adjusting the etching conditions such as gas compositions, gas flow rates, pressure, supply power and so on. As a matter of fact, both etching process and depositing process coexist in a deep reactive ion etching process, and the etching process and the depositing process can alternately dominate the deep reactive ion etching process under varying etching conditions and thus alternately produce an etching effect and a depositing effect on the side walls of the mesh holes. In a deposition dominated process, polymers can be deposited on the side walls of the mesh holes 143 to protect them from further etching. Therefore, a carefully controlled deep reactive ion etching process may produce mesh holes 143 with a tapered profile and the mesh holes 143 finally merge into one hole at the top side of the silicon substrate.

Since the mesh holes 143 merge into one hole in the vicinity of the acoustic sensing part 11 of the microphone 10, there is enough room for the diaphragm 200 to vibrate. In this embodiment, however, the mesh-structured back hole 140 may include a central mesh beam 141c extending from the bottom side to the top side of the silicon substrate 100 and attaching to the center of the diaphragm 200 as a supporting anchor. The central mesh beam 141c will not affect the vibration of the center-constrained diaphragm 200 in this embodiment, but can both provide additional support to the acoustic sensing part 11 and enhance the strength of the mesh beams. Furthermore, the plurality of mesh holes of the mesh-structured back hole are uniformly or symmetrically distributed across the mesh-structured back hole, so that an acoustic wave can be uniformly streamlined to ensure a balanced vibration of the diaphragm 200.

The Second Embodiment

Figure 6:
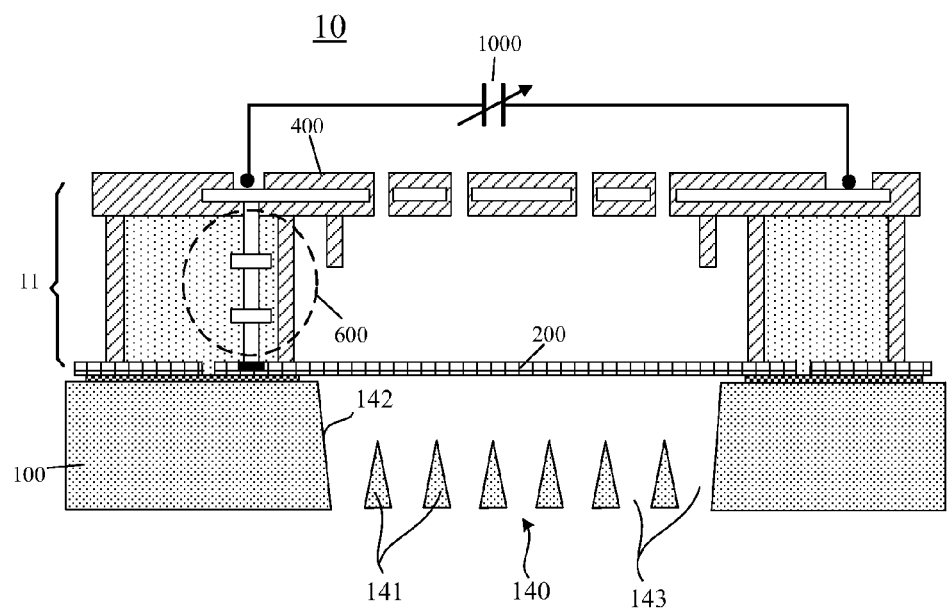
FIG. 6 is a cross-sectional view showing the structure of the silicon based MEMS microphone according to the second embodiment of the present invention.
Figure 7:
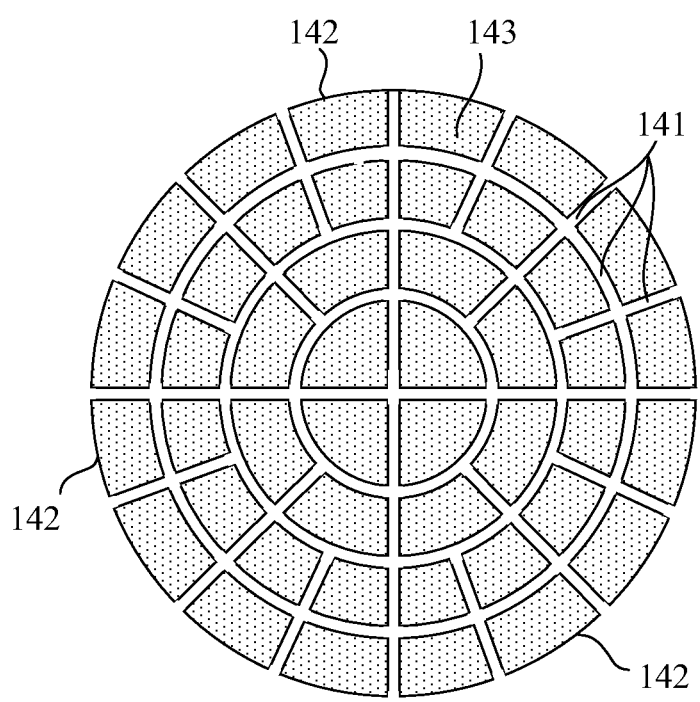
FIG. 7 is a plan view showing an exemplary pattern of the mesh-structured back hole formed in the silicon substrate of the microphone of FIG. 6 when viewed from the bottom side of the silicon substrate.

FIG. 6 is a cross-sectional view showing the structure of the silicon based MEMS microphone according to the second embodiment of the present invention, and FIG. 7 is a plan view showing an exemplary pattern of the mesh-structured back hole formed in the silicon substrate of the microphone of FIG. 6 when viewed from the bottom side of the silicon substrate.

Comparing FIG. 6 with FIG. 2, the acoustic sensing part of the microphone according to the second embodiment of the present invention is distinguished from that according to the first embodiment in that, in the second embodiment, the acoustic sensing part 11 of the microphone 10 may further include an interconnection column 600 provided between the edge of diaphragm 200 and the edge of the backplate 400 for electrically wiring out the diaphragm using CMOS metal interconnection method, and the periphery of the diaphragm 200 is fixed. An example of the acoustic sensing part 11 as above is described in details in the international application No. PCT/CN2010/075514, the related contents of which are incorporated herein by reference.

Comparing FIG. 7 with FIG. 3, the mesh-structured back hole 140 according to the second embodiment of the present invention is distinguished from that according to the first embodiment in that, in the second embodiment, the mesh beams 141 are all formed with their thickness (or height) less than that of the silicon substrate 100, so that there is enough room for the diaphragm 200 in the microphone 10 according to the second embodiment to vibrate.

Although two kinds of mesh beam patterns are described with reference to the first and the second embodiment, other uniform and/or symmetrical mesh beam patterns are possible, which will not be described in details.

It should be noted that the mesh-structured back hole may be provided with a circular shape, a square shape, a rectangular shape or other polygonal shape.

Furthermore, any silicon based MEMS microphone according to the present invention can be integrated with a CMOS circuitry on a single chip to form a microphone system.

Hereinafter, a microphone package according to the present invention will be briefly described with reference to FIG. 8.

Figure 8:
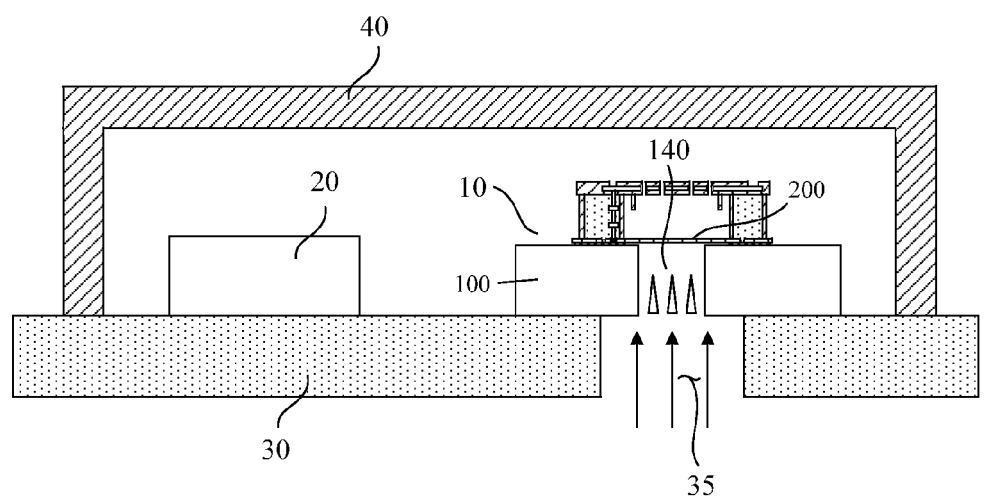
FIG. 8 is a cross-sectional view showing an exemplary structure of a silicon based MEMS microphone package according to the present invention.

FIG. 8 is a cross-sectional view showing an exemplary structure of a silicon based MEMS microphone package according to the present invention. As shown in FIG. 8, a microphone package according to the present invention comprises a PCB board provided with an acoustic port thereon, a silicon based MEMS microphone according to the present invention, and a cover.

Specifically, in a silicon based MEMS microphone package according to the present invention, as shown in FIG. 8, a silicon based MEMS microphone 10 according to the present invention and other integrated circuits 20 are mounted on a PCB board 30 and enclosed by a cover 40, wherein a mesh-structured back hole 140 according to the present invention formed in the substrate 100 of the MEMS microphone 10 is aligned with an acoustic port 35 formed on the PCB board 30. An external acoustic wave, as shown by the arrows in FIG. 8, travels through the acoustic port 35 on the PCB board 30 and the mesh-structured back hole 140 in the substrate 100 of the microphone 10 to vibrate the diaphragm 200 of the microphone 10.

It should be noted that the acoustic port 35 may be formed on the cover, and aligned with the mesh-structured back hole of the microphone in the silicon based MEMS microphone package according to the present invention.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A silicon based MEMS microphone, comprising:
   a silicon substrate,
   an acoustic sensing part supported on the silicon substrate, the acoustic sensing part including a diaphragm, a perforated backplate and an air gap between the diaphragm and the backplate, and
   a mesh-structured back hole formed in the substrate and aligned with the acoustic sensing part, wherein the mesh-structured back hole includes a plurality of mesh beams which are interconnected with each other and supported on the side wall of the mesh-structure back hole; the plurality of mesh beams and the side wall define a plurality of mesh holes which all have a tapered profile and merge into one hole in the vicinity of the acoustic sensing part at the top side of the silicon substrate.

2. The silicon based MEMS microphone of claim 1, wherein the mesh-structured back hole is formed from the bottom side of the silicon substrate using a controlled deep reactive ion etching process.

3. The silicon based MEMS microphone of claim 1, wherein the plurality of mesh holes are uniformly and/or symmetrically distributed across the mesh-structured back hole.

4. The silicon based MEMS microphone of claim 1, wherein the mesh-structured back hole is provided with a circular shape, a square shape, a rectangular shape or other polygonal shape.

5. The silicon based MEMS microphone of any claim of claims 1-4, wherein the diaphragm is a compliant diaphragm;
   and wherein the diaphragm and the backplate are used to form electrode plates of a variable condenser.

6. The silicon based MEMS microphone of claim 5, wherein
   said compliant diaphragm is formed with a part of a silicon device layer stacked on the silicon substrate with an oxide layer sandwiched in between;
   said perforated backplate is located above the diaphragm and formed with CMOS passivation layers with a metal layer imbedded therein which serves as an electrode plate of the backplate; and
   the acoustic sensing part of the said microphone further includes an interconnection column provided between the center of the diaphragm and the center of the backplate for mechanically suspending and electrically wiring out the diaphragm using CMOS metal interconnection method, and the periphery of the diaphragm is free to vibrate.

7. The silicon based MEMS microphone of claim 6, wherein the mesh-structured back hole includes a central mesh beam extending from the bottom side to the top side of the silicon substrate and attaching to the center of the diaphragm.

8. The silicon based MEMS microphone of claim 5, wherein
   said compliant diaphragm is formed with a part of a silicon device layer stacked on the silicon substrate with an oxide layer sandwiched in between;
   said perforated backplate is located above the diaphragm and formed with CMOS passivation layers with a metal layer imbedded therein which serves as an electrode plate of the backplate; and
   the acoustic sensing part of the said microphone further includes an interconnection column provided between the edge of diaphragm and the edge of the backplate for electrically wiring out the diaphragm using CMOS metal interconnection method, and the periphery of the diaphragm is fixed.

9. A microphone system, comprising a silicon based MEMS microphone of any claim of claims 1-8 and a CMOS circuitry integrated on a single chip.

10. A microphone package, comprising a PCB board; a silicon based MEMS microphone of any claim of claims 1-8, mounted on the PCB board; and a cover, enclosing the microphone, wherein an acoustic port is formed on any of the PCB board and the cover, and aligned with the mesh-structured back hole of the microphone.

* * * * *